United States Patent
Umans

(10) Patent No.: US 7,382,138 B1
(45) Date of Patent: Jun. 3, 2008

(54) SYSTEM AND METHOD FOR NON-DESTRUCTIVE TESTING OF ROTORS

(75) Inventor: Stephen D. Umans, Belmont, MA (US)

(73) Assignee: Reliance Electric Technologies, LLC, Mayfield Heights, OH (US)

( * ) Notice: Subject to any disclaimer, the term of this patent is extended or adjusted under 35 U.S.C. 154(b) by 0 days.

(21) Appl. No.: 11/540,191

(22) Filed: Sep. 29, 2006

(51) Int. Cl.
  *G01R 31/06* (2006.01)
  *G01R 27/08* (2006.01)
(52) U.S. Cl. ............... 324/545; 324/772; 340/648
(58) Field of Classification Search ........... 324/545
  See application file for complete search history.

(56) References Cited

U.S. PATENT DOCUMENTS

| | | | | |
|---|---|---|---|---|
| 4,377,784 | A * | 3/1983 | Saito et al. | 324/772 |
| 4,777,446 | A * | 10/1988 | Santandrea et al. | 324/545 |
| 6,650,122 | B2 * | 11/2003 | Matthews et al. | 324/545 |
| 6,794,883 | B2 * | 9/2004 | Klingel | 324/522 |
| 7,135,830 | B2 * | 11/2006 | El-Ibiary | 318/561 |

* cited by examiner

*Primary Examiner*—Andrew H. Hirshfeld
*Assistant Examiner*—John Zhu
(74) *Attorney, Agent, or Firm*—Thompson Coburn LLP

(57) ABSTRACT

A method is provided for testing an electrical characteristic of a rotor. In one embodiment, the method may include applying current to the rotor, measuring voltage drop between first and second positions on the rotor, and evaluating the electrical characteristic of the rotor based at least on the voltage drop and the current. In another embodiment, the method may include coupling a first set of leads to a first end portion of the rotor at a first set of angular positions about an axis of the rotor. The method also may include coupling a second set of leads to a second end portion of the rotor at a second set of angular positions about the axis of the rotor. In addition, the method may include coupling the first and second sets of leads to a current source to provide a current flow through the rotor from the first end portion to the second end portion. Furthermore, the method may include engaging a first probe to the first end portion and a second probe to the second end portion to measure voltage drop.

15 Claims, 4 Drawing Sheets

SYSTEM AND METHOD FOR NON-DESTRUCTIVE TESTING OF ROTORS

STATEMENT REGARDING FEDERALLY SPONSORED RESEARCH & DEVELOPMENT

This invention was made with Government support under a United States Department of Defense Cooperative Agreement No. 2004-602 for services supporting a Prime Cooperative Agreement No. W911NF-04-2-0008. The Government has certain rights in the invention.

BACKGROUND

The present invention relates generally to the field of electrical rotating machines, such as motors, generators, or the like. More particularly, the present techniques concern the electrical/electromechanical performance of rotor assemblies of such rotating machines.

Electrical rotating machines, such as electric motors, generators, and other similar devices, are quite common and may be found in diverse industrial, commercial, and consumer settings. These machines are produced in a variety of mechanical and electrical configurations. The configuration of these devices may depend upon the intended application, the operating environment, the available power source, or other similar factors. In general, these devices include a rotor surrounded at least partially by a stator.

For instance, one common design of electrical rotating machine is the induction motor, which is used in numerous and diverse applications. In industry, such motors are employed to drive various kinds of machinery, such as pumps, conveyors, compressors, fans and so forth, to mention only a few. Conventional alternating current (AC) electric induction motors may be constructed for single-phase or multiple-phase power.

Induction motors typically employ a rotor assembly positioned within a stator assembly that includes a slotted core in which groups of coil windings are installed. More particularly, the rotor assemblies of such motors often include a core formed of a series of magnetically conductive laminations arranged to form a lamination stack capped at each end by electrically conductive end rings. Additionally, typical rotors include a series of conductors that are formed of a nonmagnetic, electrically conductive material and that extend through the rotor core. These conductors are electrically connected to one another via the end rings, thereby forming one or more closed electrical pathways. For example, the conductors may include a plurality of rotor bars extending axially through the series of magnetically conductive laminations and arranged at different angular positions around the axis of the rotor.

In squirrel cage induction motors, the rotor bars and end rings are typically formed by a casting process in which the rotor is placed in a mold and a molten metal is poured into the rotor slots to form the rotor bars and end rings. Flaws in the rotor can result in undesirable reduction in the electrical/electromechanical performance, e.g., reduced efficiency, excessive slip under load, unexpected torque pulsations, and higher than expected operating temperatures. It is not possible to visually inspect the quality of the resultant casting because the resultant rotor bars are embedded within the rotor. To check for the presence of voids and contaminants in the casting, it has typically been necessary to cut open a representative or suspect rotor, essentially destroying the rotor. Similarly, the electrical characteristics of rotors formed by other manufacturing techniques generally cannot be tested without destroying the rotor.

BRIEF DESCRIPTION

In certain embodiments discussed in detail below, electrical characteristics of a rotor are examined by taking a plurality of measurements without destroying the rotor. For example, a plurality of voltage drop measurements may be taken across the opposite ends of the rotor. Each voltage drop measurement may correspond to a different angular position about the circumference of the rotor. Using these voltage drop measurements, the conductivity of the rotor can be analyzed as a performance indicator. For example, if the voltages are fairly uniform among the different angular positions and if the average voltage is equal to an expected value (e.g., for the particular material and rotor design), then the test indicates that the rotor is generally good and will likely operate as expected. On the other hand, if the voltages are fairly uniform and if the average voltage is higher than expected (i.e., indicating a lower than expected rotor bar conductivity), then the test indicates that the rotor is problematic and may not perform up to expectations. Furthermore, if the voltages vary with angular position and have a higher than expected average voltage, then the test indicates that the rotor is problematic and will not likely meet expectations.

In one embodiment, a method is provided for testing an electrical characteristic of a rotor. The method may include applying current to the rotor, measuring voltage drop between first and second positions on the rotor, and evaluating the electrical characteristic of the rotor based at least on the voltage drop and the current.

In another embodiment, a method is provided for testing an electrical characteristic of a rotor. The method may include coupling a first set of leads to a first end portion of the rotor at a first set of angular positions about an axis of the rotor. The method also may include coupling a second set of leads to a second end portion of the rotor at a second set of angular positions about the axis of the rotor. In addition, the method may include coupling the first and second sets of leads to a current source to provide a current flow through the rotor from the first end portion to the second end portion. Furthermore, the method may include engaging a first probe to the first end portion and a second probe to the second end portion to measure voltage drop.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
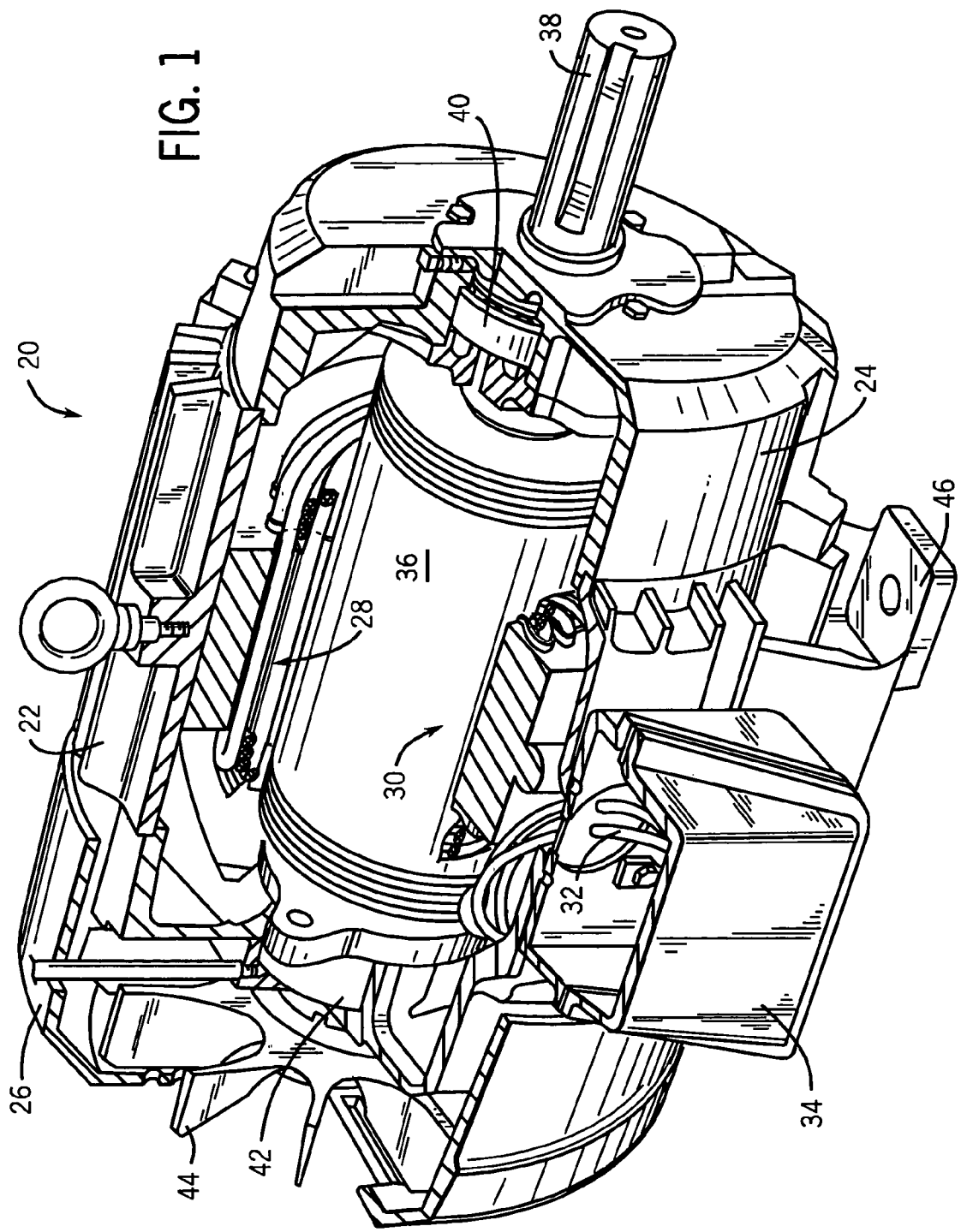
FIG. 1 is a perspective view of an exemplary embodiment of an induction motor.

The systems and methods discussed in further detail below facilitate the research, development, and quality control of rotor production by providing data on the electrical characteristics of the rotor without destroying the rotor in the process. The disclosed embodiments may be used to test a variety of rotors, including rotors found in motors, generators, and other electromechanical devices having a squirrel cage rotor structure or the like. For example, an exemplary application of the disclosed techniques is an induction motor or a line-start synchronous motor, e.g., having a squirrel cage or similar rotor. Moreover, the disclosed techniques may be used for testing rotors manufactured via casting and other techniques. In other words, the disclosed techniques are not intended to be limited to any particular application, type of rotor, or manufacturing technique used to produce the rotor. However, for purposes of discussion, the disclosed techniques are described with reference to a die-cast induction motor rotor, such as a squirrel cage induction motor rotor.

As discussed in detail below, a non-destructive test procedure has been developed to test the electrical characteristics of die-cast induction-motor rotors, among others. Specifically, as discussed in detail below, current and voltage drop measurements are taken as an indication of conductivity of the rotor bars or conductors. The voltage measurements are used to evaluate the conductivity at various positions (e.g., angular), which can be compared for an indication of uniformity and which can be averaged for a comparison with an expected conductivity. In certain embodiments, the voltage drop measurements may be taken between different angular positions at the same end ring of the rotor, between one or more aligned angular positions between opposite end rings of the rotor, or between different locations intermediate to the opposite end rings of the rotor, or a combination thereof. Current also may be applied in a similar manner. In either case, the voltage measurements may be used to calculate conductivity and/or evaluate a degree of variation relative to an expected or nominal value.

For example, current (e.g., AC or DC current) is supplied uniformly to the end rings of the rotor. For example, the current may be applied at a number of angular positions uniformly distributed around the end rings, wherein the same current is applied at each of the angular positions. If there are no flaws in the rotor casting, then the result is an end-ring to end-ring voltage drop that is generally uniform with respect to the angular location around the axis of the rotor and, also, an average voltage drop is generally equal or close to the expected value. If there are flaws in the rotor casting (e.g. cracks or voids in the rotor bars or end rings, contamination in the cast conductor, etc.), then the result is a non-uniform voltage drop between the end rings and/or a higher than expected average voltage drop. In other words, the voltage drop may vary at different angular positions around the rotor, and the variance is indicative of casting problems (or other manufacturing problems) that may result in less than desirable electrical/electromechanical performance of the rotor.

The conductivity of the rotor bar conducting material can be calculated based upon the current supplied to the rotor, the voltage drop, the number of rotor slots, and the area and length of the rotor slots. In turn, the calculated conductivity can be used for a comparison among the different angular positions, as discussed in the preceding paragraph, and also for a comparison with an expected conductivity of the rotor bars. For example, an angular variation of conductivity can be calculated among the different angular positions. By further example, the average conductivity (e.g., among the different angular positions) can be compared with the expected value (e.g. the conductivity of the rotor bar material) to determine another indicator of the expected electrical/electromechanical performance of the rotor (e.g., rotor casting). A significant variation in conductivity with position and/or a higher than expected average value is an indication that the rotor will provide poorer than expected electrical/electromechanical performance. The variation may be indicative of voids, contaminants, and other defects throughout the entire rotor, e.g., all of the rotor bars. These tests can be performed without destroying the rotor, and thus can be used on all rotors in a production line without first requiring some other indication that the rotor might be defective. Again, both the average voltage and variations in voltage may be indicative of the quality of the rotor.

Turning now to the drawings, and referring first to FIG. 1, an electric motor is shown and designated generally by the reference numeral 20. The illustrated motor 20 is simply one example that may benefit from the non-destructive rotor testing systems and methods described in detail below. In the embodiment illustrated in FIG. 1, motor 20 is an induction motor housed in an enclosure. Accordingly, motor 20 includes a frame 22 open at front and rear ends and capped by a front end cap 24 and a rear end cap 26. The frame 22, front end cap 24, and rear end cap 26 form a protective shell, or housing, for a stator assembly 28 and a rotor assembly 30. Stator windings are electrically interconnected to form groups, and the groups are, in turn, interconnected. The windings are further coupled to terminal leads 32. The terminal leads 32 are used to electrically connect the stator windings to an external power cable coupled to a source of electrical power. Energizing the stator windings produces a magnetic field that induces rotation of the rotor assembly 30. The electrical connection between the terminal leads and the power cable is housed within a conduit box 34.

In the embodiment illustrated, rotor assembly 30 comprises a rotor 36 supported on a rotary shaft 38. The shaft 38 is configured for coupling to a driven machine element for transmitting torque to the machine element. Rotor 36 and shaft 38 are supported for rotation within frame 22 by a front bearing set 40 and a rear bearing set 42 carried by front end cap 24 and rear end cap 26, respectively. In the illustrated embodiment of electric motor 20, a cooling fan 44 is supported for rotation on shaft 38 to promote convective heat transfer through the frame 22. The frame 22 generally includes features permitting it to be mounted in a desired application, such as integral mounting feet 46. However, a wide variety of rotor configurations may be envisaged in motors that may employ the techniques outlined herein. Moreover, the disclosed techniques may be employed on rotors for a variety of different motors, generators, and other electromechanical devices.

Figure 2:
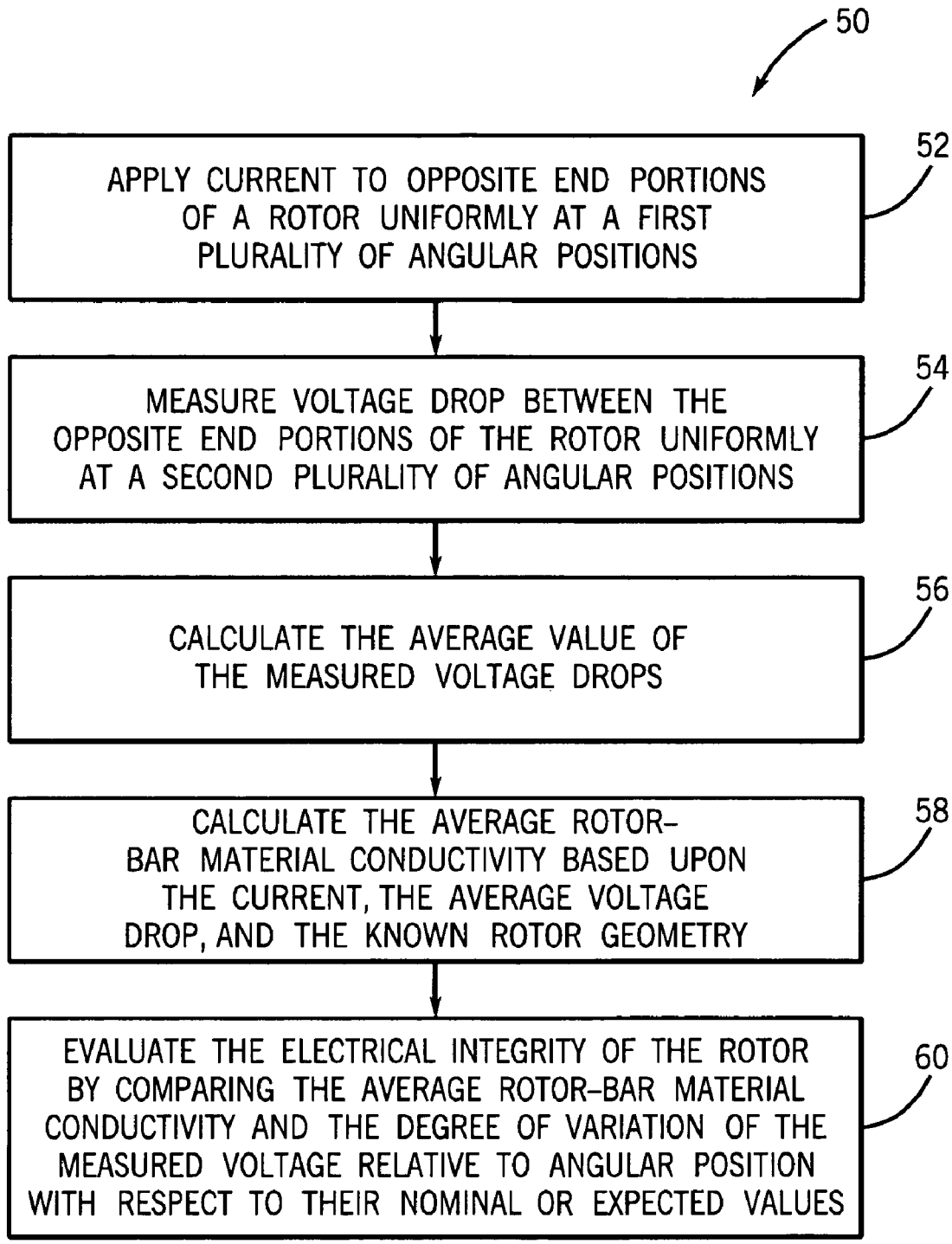
FIG. 2 is a flow chart of an exemplary embodiment of a non-destructive method for testing the electrical characteristics of a rotor.

FIG. 2 is a flow chart illustrating an exemplary embodiment of a non-destructive process 50 for testing the electrical characteristics of a rotor, such as the rotor 36 illustrated in FIG. 1. In the illustrated embodiment, the process 50 begins by applying a current (e.g., a DC current) to opposite end portions (e.g., end rings) of a rotor uniformly at a first plurality of angular positions (block 52). For example, a first set of leads may be coupled to a first end portion of the rotor, while a second set of leads may be coupled to a second end portion of the rotor. However, the first and second sets of leads are may be coupled to the rotor at the same angular positions about the axis of the rotor. In other words, the first set of leads is axially aligned with the second set of leads, respectively. The first and second set of leads should generally be spaced uniformly or with equally spaced angular positions about the axis of the rotor. In addition, the current should generally be equalized among the first and second sets of leads as discussed in further detail below.

The process 50 may then proceed to measure voltage drop between the opposite end portions of the rotor uniformly at a second plurality of angular positions (block 54). For example, first and second probes may be engaged with the opposite end portions at the second plurality of angular positions, wherein the first and second probes are coupled to a voltmeter. Again, the first and second probes are generally engaged with the rotor at the same angular positions about the axis of the rotor. In other words, at each measurement point, the first probe is axially aligned with the second probe at the opposite end portions. In certain embodiments, the first and second pluralities of angular positions for the applied current 52 and the measured voltage 54 are identical or generally close to one another. However, the angular positions of the applied current 52 and the measured voltage 54 in blocks 52 and 54 do not necessarily need to match. Additionally, the first plurality of angular positions, the second plurality of angular positions, or both may or may not be generally aligned with the rotor bars disposed within the rotor. The process 50 does not necessarily require matching between the rotor bars and the applied current 52 or the measured voltage 54.

The process 50 may then proceed to calculate an average value of the measured voltage drops (block 56). In turn, the process 50 may continue to calculate an average rotor-bar material conductivity based upon the current, the average voltage drop, and the known rotor geometry (block (58). Finally, the process 50 may proceed to evaluate the electrical quality of the rotor by comparing the average rotor-bar material conductivity and the degree of variation of the measured voltage relative to angular position with respect to their nominal or expected values (block 60).

If the voltage drop (and hence the conductivity) varies from one angular position to another around the axis of the rotor, then this variation may be generally indicative of one or more flaws in the manufacturing of the rotor, e.g., the rotor bars and/or end rings. Also, if the average value of the voltage drops (and hence the average conductivity) varies by some amount relative to the expected or nominal value, then the variance is generally indicative of flaws in the rotor. For example, one or more of the rotor bars may have flaws, such as cracks, voids, contaminants, or other non-uniformities. These flaws may arise from problems with the casting process, the source materials, and the die, among other things. If the rotor has no flaws, then the voltage variation with angular position will be small and the average value will be equal to the expected value.

Thus, the process 50 provides two different measurements of the electrical characteristics of the rotor, one based on the angular variation of the voltage drop (and hence conductivity) around the rotor and the other based on the average voltage drop (and hence average rotor-bar material conductivity) relative to the expected material conductivity. Again, these techniques provide an indication of the expected electrical/electromechanical performance of the rotor without cutting or otherwise destroying the rotor. This technique can reduce speculation about possible defects in rotors in a production line, or design stage, or even after installation and use in a complete motor.

Figure 3:
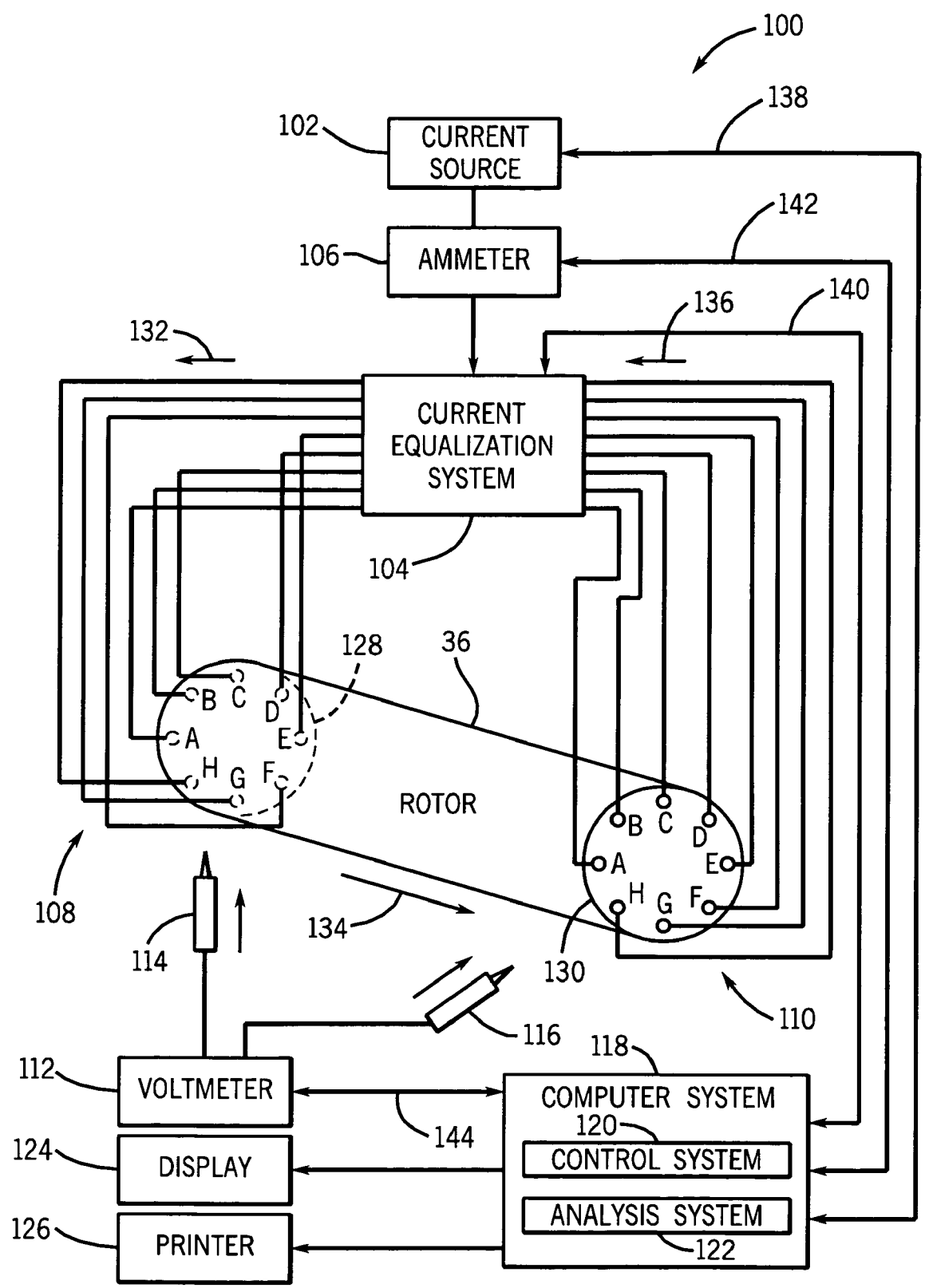
FIG. 3 is a block diagram of an exemplary system for the non-destructive testing of the electrical characteristics of a rotor.

FIG. 3 is a block diagram of an exemplary embodiment of a system 100 for the non-destructive testing of the electrical characteristics of a rotor, such as the rotor 36 as illustrated in FIG. 1. In the illustrated embodiment, the system 100 includes a current source 102, a current equalization system 104 coupled to the current source 102, and an ammeter 106 disposed in electrical communication between the current source 102 and the current equalization system 104. The system 100 also includes first and second sets of leads 108 and 110 coupled to the current equalization system 104. In addition, the illustrated system 100 includes a voltmeter 112 having first and second probes 114 and 116. Some embodiments of the system 100 also include a computer system 118 having a control system 120 and an analysis system 122, among other features. For example, the computer system 118 may include a processor, memory, communication circuitry, and various hardware and software as the basis for the control system 120 and the analysis system 122. The computer system 118 also may include a peripheral display 124 and printer 126 to output the results of the non-destructive rotor testing.

The current source 102 is configured to apply current to the rotor 36 from a first end portion 128 (e.g., end ring) lengthwise along the rotor 36 to a second end portion 130 (e.g., end ring). As illustrated, the first set of leads 108 is removably coupled to the first end portion 128 of the rotor 36 at a plurality of equally spaced angular positions, as indicated by reference characters A, B, C, D, E, F, G, and H. Similarly, the second set of leads 110 is removably coupled to the second end portion 130 of the rotor 36 at a plurality of equally spaced angular positions, as indicated by reference characters A, B, C, D, E, F, G, and H. In the illustrated embodiment, the angular positions of the first and second leads 108 and 110 are axially aligned with one another. In other words, the angular positions are generally identical on the first and second end portions 128 and 130 of the rotor 36. In the manner, the uniformity enables accurate measurement of the variation of the electrical characteristics of the rotor about the axis of the rotor 36. The first and second leads 108 and 110 may be coupled to the rotor 36 via a variety of fastening mechanisms.

Opposite from the rotor 36, the first and second sets of leads 108 and 110 are coupled to the current equalization system 104, which is configured to equalize the current distributed to the rotor 36 at the plurality of equally spaced angular positions A, B, C, D, E, F, G, and H. In other words, the current equalization system 104 ensures that the current supplied at each of the angular positions A-H is generally identical or uniform. Altogether, the equally spaced angular positions of the first and second sets of leads 108 and 110 and the uniform distribution of current provided by the current equalization system 104 improves the overall accuracy of the non-destructive testing of rotor electrical characteristics.

For example, during a non-destructive testing procedure, the system 100 may employ the current source 102 (e.g., DC current source) and the current equalization system 104 (e.g., resistors in-line with the leads 108 and 110) to apply a current uniformly through the first set of leads 108, through the rotor 36, and through the second set of leads 110, as indicated by arrows 132, 134, and 136, respectively. The illustrated system 100 also may measure the current via the ammeter 106. Furthermore, the voltmeter 112 is used to measure a voltage drop from the first end portion 128 to the second end portion 130 of the rotor 36 via the probes 114 and 116. Specifically, the probes 114 and 116 are coupled to the first and second end portions 128 and 130 at each of the equally spaced angular positions A-H. Thus, in the illustrated embodiment, the voltmeter 112 is used to obtain eight measurements of voltage drop across the rotor 36 at equally spaced angular positions about the axis. However, in other embodiments, the voltmeter 112 may be used to obtain fewer or additional measurements of the voltage drop between the first and second end portions 128 and 130 of the rotor 36. Also, the voltage drop measurements may be taken at the identical angular positions A-H as the connection points for the first and second leads 108 and 110. Alternatively, the voltage drop measurements may be taken at other angularly spaced positions about the axis of the rotor 36. As discussed above with reference to FIG. 2, these voltage drop measurements can be used to calculate an angular variation of the electrical characteristics of the rotor 36. In addition, the voltage drop measurements may be used to calculate an average conductivity of the rotor 36, which can then be compared with an expected value of the conductivity of the rotor 36. In this manner, variations of these measurements from their expected values may be indicative of various flaws within the rotor 36. The specific calculations are discussed in further detail below.

Although a user may manually configure and operate the current source 102, the current equalization system 104, the ammeter 106, and the voltmeter 112, certain embodiments of the system 100 may use the computer system 118 to automate at least some of the control and analysis functions. For example, the control system 120 of the computer system 118 may be configured to communicate with the current source 102, the current equalization system 104, the ammeter 106, and/or the voltmeter 112 to transmit control signals and/or receive data feedback, as indicated by arrows 138, 140, 142, and 144, respectively. For example, the computer system 118 may obtain data indicative of current from the ammeter 106 and data indicative of a voltage drop from the voltmeter 112. In addition, the computer system 118 may retrieve stored data or obtain user input regarding various information about the rotor 36 and the particular test. For example, the data may include the geometry of the rotor 36, the material and corresponding conductivity of the rotor 36, and other data. Using this data, the analysis system 122 may perform one or more of the steps discussed above with reference to FIG. 2. For example, the analysis system 122 may perform steps 56, 58, and 60 of the process 50 to output two different indicators of the rotor bar conductivities of the rotor 36. In turn, the computer system 118 may output the results of the testing via the display 124 and/or the printer 126.

Figure 4:
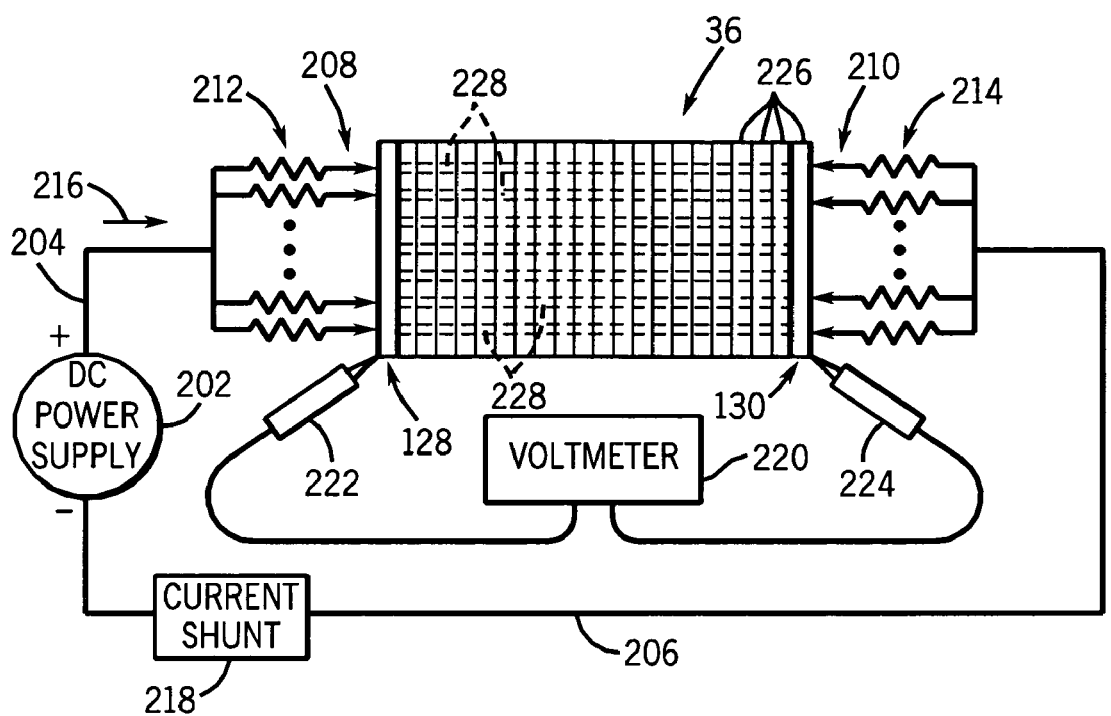
FIG. 4 is a block diagram of another embodiment of a system for the non-destructive testing of the electrical characteristics of a rotor.

FIG. 4 is a block diagram of another embodiment of a system 200 for the non-destructive testing of the electrical characteristics of a rotor, such as the rotor 36 as illustrated in FIG. 1. In the illustrated embodiment, the system 200 includes a DC power supply 202 (alternatively an AC power supply), a first lead wire assembly 204 coupled to a positive side of the power supply 202, and a second lead wire assembly 206 coupled to a negative side of the power supply 202. The first lead wire assembly 204 includes a first set of leads 208 disposed in parallel with one another, while the second lead wire assembly 206 includes a second set of leads 210 disposed in parallel with one another and generally axially aligned with the first set of leads 208 about the axis of the rotor 36. In addition, the first lead wire assembly 204 includes a first set of resistors 212 disposed in parallel with one another and in series with the first set of leads 208, respectively. Similarly, the second lead wire assembly 206 includes a second set of resistors 214 disposed in parallel with one another and in series with the second set of leads 210, respectively. These first and second sets of resistors 212 and 214 are configured to equalize current 216 flowing into the rotor 36 at the different connection points of the first and second sets of leads 208 and 210. The illustrated system 200 also includes a current shunt or measuring instrument 218, which is configured to measure current for use in the non-destructive testing of rotor electrical characteristics as discussed in further detail below. In addition, the system 200 includes a voltmeter 220 having first and second probes 222 and 224, which may be used to measure the voltage drop across the rotor 36.

In the illustrated embodiment of FIG. 4, the rotor 36 includes a plurality of rotor laminations 226 disposed one after another in an axial direction along the axis of the rotor 36 between the opposite end portions or end rings 128 and 130. In addition, the rotor 36 includes a plurality of axial conductors or rotor bars 228 extending axially along the rotor 36 crosswise through the plurality of rotor laminations 226. In the illustrated embodiment, the first and second sets of leads 208 and 210 are coupled to the first and second end portions (e.g., end rings) 128 and 130 of the rotor 36, respectively. For example, the leads 208 and 210 may connect with fins, bolts, or other portions of the end rings 128 and 130. In one embodiment, the leads 208 and 210 connect with the outside edges of the end rings 128 and 130, and the voltage probes 222 and 224 are placed in contact with the end rings 128 and 130 close to the rotor lamination stack. The first and second sets of leads 208 and 210 are also generally aligned with one another in a symmetrical pattern around the axis of the rotor 36. For example, the first and second sets 208 and 210 may be disposed at equally spaced angular positions about the axis of the rotor 36 in general parallel alignment with the axis.

The electrical conductivity of rotor bar material may be calculated based on a voltage drop between the first and second end portions 128 and 130 of the rotor 36, the current 216 measured by the current shunt 218, and the geometry and configuration of the rotor 36. Accordingly, the voltmeter 220 may be used to obtain the voltage drop at a plurality of different angular positions about an axis of the rotor 36 via the first and second probes 222 and 224. For example, the first and second probes 222 and 224 may be placed in general alignment with one another at the opposite end portions 128 and 130 at angular positions corresponding to the first and second sets of leads 208 and 210. Alternatively, the first and second probes 222 and 224 may be axially aligned with one another about the rotor 36 at different angular positions than the leads 208 and 210 and/or the rotor bars 228.

With reference to the preceding FIGS. 1-4, the rotor conductivity test described herein is intended to non-destructively measure the conductivity of rotor bar 228 material in intact induction-motor rotors 36. The test can determine the uniformity of the rotor bar 228 characteristics. If there are defective or broken bars, the test will show a non-uniformity as a function of azimuthal (i.e., angular) position around the rotor 36. The test results can be used to calculate the average conductivity of the rotor bar material based on the average value of the measured voltages.

FIGS. 3 and 4 illustrate the basic setup. The accuracy of the rotor-conductivity determination is based in part on the ability to distribute a fixed current uniformly to the end portions 128 and 130 (e.g., end-rings) of the rotor 36. The basic testing components include a DC power supply 202 capable of delivering a significant amount of current. The amount of current required will be determined by the sensitivity of the voltmeter 220 used to measure the rotor 36 voltage. It has been found that a current of 100 A is adequate for testing many rotors. For example, the DC power supply 202 may be an Agilent model 6570 or 6681A DC supply, which are manufactured by Agilent Technologies, Inc., of Palo Alto, Calif.

The testing components also include a voltmeter 220 capable of reading the small voltages produced under these test conditions. For example, the voltmeter 220 may be a Keithley 2182A nanovoltmeter, which is manufactured by Keithley Instruments, Inc., of Cleveland, Ohio. The voltmeter 220 is capable of accurately resolving micro-volt voltage levels and is capable of averaging (i.e., integrating) readings over a number of power-line cycles. The integration feature of the Keithley 2182A as well as various filter functions can be used to filter out measurement noise.

The testing components also include an instrument configured to measure the current from the DC supply. For example, the voltage across a current shunt connected in the output lead of the DC supply can be measured using a meter such as the Keithley 2182A. Such current shunts typically produce a 50 mV signal at their rated output current (e.g. 50 mV/100 A). More modern DC supplies (such as the Agilent 6570) have digital ammeters which are sufficiently accurate to be used directly.

Furthermore, as discussed in detail above, the testing components include a lead system 204 and 206 for connecting to the rotor end-rings 128 and 130, e.g., 10 leads for each end of the rotor 36. Because the resistance of the rotor 36 structure may be extremely small, the contact resistances between the leads and the rotor end rings 128 and 130 may affect the lead current, leading to a non-uniform current distribution. To eliminate this problem, a current-equalization system having a 0.1Ω resistor 212 and 214 in series with each lead is used to guarantee uniform lead currents. For example, the resistor may be an Ohmite, 50W, 0.10 Ohm, 1% power resistor, part number 850FR10, which is manufactured by Ohmite Mfg. Co. of Rolling Meadows, Ill. The value of 0.1Ω was chosen because it is significantly larger than the resistances associated with the rotor or with any contact resistance. However, others resistors, tolerances, or resistances may be used for the current-equalization system. By measuring the voltage drop across each resistor, the current in the individual current leads can be determined to verify current uniformity in the leads. Again, the Keithley 2182A may be used for this purpose. If these measurements vary by more than a certain value, e.g., 1%, then appropriate modifications to the connections should be made to insure uniformity of the current through each of the leads.

Referring back to FIG. 4, this figure is an electrical schematic of the DC current supply, which shows that the current is distributed via a set of current leads and that each lead includes a series resistance ($R_s$). Note that the power dissipation in each series resistor is as follows:

$$P_{diss} = \left(\frac{I_{dc}}{N_{leads}}\right)^2 R_s \qquad (1)$$

$I_{dc}$ is the total DC current supplied to the rotor and $N_{leads}$ is the number of leads. For example, if the supplied current is 100 A and there are 10 leads, then the power dissipation in each 0.1Ω series resistor is 10 W. To ensure that the series resistors 212 and 214 are not heated excessively (or non-uniformly), the resistors may be mounted on a common heat sink. In addition, a small fan may be used to cool the heat sink. For example, the resistors may be mounted on a finned heat-sink with an attached muffin fan, such as is used to mount large semiconductor components.

Referring back to FIG. 3, this figures shows one technique of connecting the current leads to the rotor end rings 128 and 130. For example, one lead may be connected with a large alligator clip to each of the fins on each of the end rings. In addition to ensuring that the lead currents are equal, the present technique also generally provides that the leads be connected in a uniform pattern around the end ring. For example, if the leads are coupled to uniformly distributed fins on the end rings of the rotor, then the uniformity is automatically guaranteed due to the uniform spacing of the fins.

Again, a uniform current distribution is particularly influential on the accuracy of the various calculations, e.g., blocks 56-60, of FIG. 2. If, for example, the current distribution is not uniform at different angular positions around the axis of the rotor 36, then any attempt to interpret non-uniform voltage measurements as an indication of non-uniformity of the rotor bars 228 may be incorrect because the non-uniform voltages could simply be the result of the non-uniform current distribution. Thus, after the leads are connected to the end rings 128 and 130, the DC power supply 202 may be turned on and the currents in each lead can be checked by measuring the voltage drop across each series resistor 212 and 214. If the contact made by an alligator clip is not sufficient, then the corresponding lead current may be off by more than 1% from its expected value. In such a case, the solution is typically simply a matter of re-seating the alligator clip. In alternative embodiments, the use of these resistors 212 and 214 may be eliminated and replaced with a self-regulating power supply, which is configured to regulate the currents to multiple outputs. Again, a variety of current equalization systems may be employed within the scope of the disclosed systems and methods.

If an alternate connection system is used, then uniform angular spacing of the current leads may be provided by another lead system or mounting technique. For example, a different connection system may be used with rotors 36 that have no end fins. In this system, two circular plates may be manufactured with 10 holes uniformly spaced in a circle of average radius equal to the average radius of the end ring on the rotor. Each hole contains a threaded, insulating sleeve into which bolts are screwed. The bolts are sharpened on their ends to make good contact with the rotor end rings. A threaded rod passing through the rotor 36 (in the case where the rotor is yet to be installed) or a clamping mechanism extending around the rotor 36 is used to pull the two plates together, forcing the sharpened bolts into contact with the two end rings. Each bolt can be individually adjusted to guarantee good contact with the end ring. Thus, electrical connections to the end rings are made through these bolts. The insulating sleeves guarantee that the current from each lead is directed to the end ring at the point of contact of its corresponding bolt. Before each test is conducted, the current through each of the 0.1Ω resistors is measured to ensure that the lead currents are indeed uniform. If this is not the case, the bolts are adjusted as needed.

With current applied to the rotor 36 through the end portions 128 and 130 (e.g., end rings) as discussed above, the voltage from end-ring to end-ring is measured at a number of azimuthal positions around the rotor 36. FIG. 4 illustrates the placement of the probes 222 and 224 for one such measurement. Note that in this case, the voltage is being measured by a pair of instrument probes 222 and 224 pushed against the rotor end rings 128 and 130 as close as possible to the end of the laminations as shown in FIG. 4.

Also, note that the probes 222 and 224 are placed in the same azimuthal location at each end of the rotor 36.

By making the voltage measurements at a number of azimuthal locations around the rotor 36, it is possible to determine the uniformity of the rotor 36 properties (e.g. the rotor-bar resistance). For example, in the case of a rotor 36 with 10 fins on each end ring, it is relatively straight forward to make 20 uniformly-spaced measurements around the rotor 36. The number of measurement points does not necessarily equal the number of rotor bars 228, and the measurement points are not necessarily at the location of the rotor bars 228.

Under the assumption that the voltage measurements are relatively uniform (e.g., no defective or broken rotor bars 228), the rotor-bar resistance $R_{bar}$ can be calculated as:

$$R_{bar} = \frac{V_{avg}}{I_{bar}} = \frac{N_{bar} V_{avg}}{I_{dc}} [\Omega] \qquad (2)$$

where
 $V_{avg}$=average value of the measured voltages [V]
 $N_{bar}$=number of rotor bars
 $I_{dc}$=total supply current [A]
 $I_{bar}=I_{dc}/N_{bar}$=average bar current [A]

The conductivity of the rotor bar material can then be calculated as:

$$\sigma = \frac{l_{bar}}{R_{bar} A_{bar}} [(\Omega \cdot m)^{-1}] \qquad (3)$$

where
 $l_{bar}$=bar length [m]
 $A_{bar}$=conductor cross-sectional area of the rotor bar [m²]

Note that $A_{bar}$ is the actual cross-sectional area of the conductor in the rotor bar 228. It may be slightly different from the rotor slot area, due for example to shrinkage following casting of the rotor cage. For any given class of rotors, $A_{bar}$ could be measured by etching away the rotor laminations and directly measuring the rotor bar. Alternatively, an estimate of $A_{bar}$, based upon the known slot area modified by a correction factor to account for shrinkage can be used. Similarly, if the rotor 36 is skewed, the bar length $l_{bar}$ will be slightly longer than the rotor stack length.

The power dissipated in the rotor 36 during the test is typically very small. For example, a current of 100 A resulting in a voltage on the order of 0.2 mV produces a power dissipation of 20 mW. Hence the rotor 36 will not be heated by the test current and the calculated value of conductivity generally corresponds to the rotor 36 temperature at the time of the test, typically the room ambient temperature unless the rotor 36 is pre-heated before the test.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method for testing an electrical characteristic of a rotor, comprising:
 coupling a first set of leads to a first end portion of the rotor at a first set of angular positions about an axis of the rotor;
 coupling a second set of leads to a second end portion of the rotor at a second set of angular positions about the axis of the rotor;
 coupling the first and second sets of leads to a current source to provide a current flow through the rotor from the first end portion to the second end portion; and
 engaging a first probe to the first end portion and a second probe to the second end portion to measure voltage drop.

2. The method of claim 1, comprising analyzing the electrical characteristic of the rotor based on the voltage drop.

3. The method of claim 2, wherein analyzing comprises calculating an angular variation of the electrical characteristic relative to an expected value, or a nominal value, or a combination thereof.

4. The method of claim 2, wherein analyzing comprises calculating an average conductivity of the rotor based on the voltage drop, and comparing the average conductivity relative to an expected conductivity of the rotor.

5. The method of claim 1, wherein coupling the first set of leads comprises equally spacing the first set of leads at the first set of angular positions, respectively, and wherein coupling the second set of leads comprises equally spacing the second set of leads at the second set of angular positions, respectively.

6. The method of claim 1, comprising equalizing a distribution of the current flow into the first set of leads or the second set of leads.

7. The method of claim 1, wherein coupling the first set of leads and coupling the second set of leads comprises aligning the first and second sets of leads with one another.

8. The method of claim 1, wherein engaging the first probe to the first end portion and the second probe to the second end portion comprises aligning the first and second probes with one another.

9. The method of claim 1, comprising repeating the step of engaging the first probe to the first end portion and the second probe to the second end portion at a plurality of angular positions about the axis of the rotor.

10. A system for testing an electrical characteristic of a rotor, comprising:
 a first set of leads coupled to a first end portion of the rotor at a first set of angular positions about an axis of the rotor;
 a second set of leads coupled to a second end portion of the rotor at a second set of angular positions about the axis of the rotor;
 a current source coupled to the first and second sets of leads to provide a current flow through the rotor from the first end portion to the second end portion; and a voltmeter coupled to a first probe and a second probe, wherein the first probe is coupled to the first end portion and the second probe is coupled to the second end portion, wherein the voltmeter is measures a voltage drop between the first and second end portions.

11. The system of claim 10, wherein the first and second sets of angular positions are axially aligned with one another, and wherein the first and second probes are configured to axially align with one another on the rotor.

12. The system of claim 10, comprising a current equalization system disposed between the current source and the first set of leads, the second set of leads, or a combination thereof.

13. The system of claim 10, wherein the electrical characteristic of the rotor can be calculated based on the voltage drop.

14. The system of claim 10, comprising a computerized analysis system configured to calculate an angular variation of conductivity of the rotor based on the voltage drop measured at different angular positions around the axis of the rotor.

15. The system of claim 10, comprising a computerized analysis system configured to calculate a difference between an expected conductivity of the rotor and an average conductivity of the rotor based at least in part on the voltage drop measured at different angular positions around the axis of the rotor.

* * * * *